United States Patent
Harris et al.

(10) Patent No.: US 11,428,760 B2
(45) Date of Patent: Aug. 30, 2022

(54) SYSTEM AND METHOD FOR REDUCING PERIPHERAL NERVE STIMULATION AT HIGHER GRADIENT AMPLITUDES AND FASTER GRADIENT SLEW RATES IN MAGNETIC RESONANCE IMAGING

(71) Applicant: SYNAPTIVE MEDICAL INC., Toronto (CA)

(72) Inventors: Chad Harris, Toronto (CA); Geron Bindseil, Toronto (CA); William Handler, Toronto (CA)

(73) Assignee: SYNAPTIVE MEDICAL INC., Toronto (CA)

( * ) Notice: Subject to any disclaimer, the term of this patent is extended or adjusted under 35 U.S.C. 154(b) by 790 days.

(21) Appl. No.: 16/346,470

(22) PCT Filed: Oct. 31, 2016

(86) PCT No.: PCT/IB2016/056565
§ 371 (c)(1),
(2) Date: Apr. 30, 2019

(87) PCT Pub. No.: WO2018/078428
PCT Pub. Date: May 3, 2018

(65) Prior Publication Data
US 2020/0057124 A1    Feb. 20, 2020

(51) Int. Cl.
*G01R 33/56* (2006.01)
*G01R 33/28* (2006.01)
(Continued)

(52) U.S. Cl.
CPC ......... *G01R 33/288* (2013.01); *G01R 33/385* (2013.01); *G01R 33/42* (2013.01); *G01V 3/175* (2013.01)

(58) Field of Classification Search
CPC ....... A61B 5/055; G01R 33/56; G01R 33/563
(Continued)

(56) References Cited

U.S. PATENT DOCUMENTS 7,432,713 B2   10/2008   Candidas
7,639,011 B2   12/2009   Candidas
(Continued)

OTHER PUBLICATIONS

International Search Report and Written Opinion for PCT/IB2016/056565, dated Mar. 23, 2017, 13 pages.

*Primary Examiner* — Walter L Lindsay, Jr.
*Assistant Examiner* — Frederick Wenderoth

(57) ABSTRACT

Described here are systems and methods for imaging a subject with a magnetic resonance imaging ("MRI") system using magnetic field gradients generated by one or more gradient coils operating with gradient coil settings (e.g., gradient amplitudes, gradient slew rates) above a threshold at which peripheral nerve stimulation ("PNS") is likely to be induced in the subject. A dielectric assembly is positioned adjacent a skin surface of the subject such that the dielectric assembly attenuates the local electric fields induced by the magnetic field gradients, which would be likely to induce PNS when the dielectric assembly is not arranged adjacent the skin surface of the subject. As a result of the dielectric assembly placed adjacent the skin surface of the subject, the gradient coil settings can be increased above the threshold without inducing PNS in the subject.

17 Claims, 3 Drawing Sheets

(51) Int. Cl.
    *G01R 33/385*     (2006.01)
    *G01R 33/42*     (2006.01)
    *G01V 3/175*     (2006.01)

(58) Field of Classification Search
    USPC .......................................................... 600/410
    See application file for complete search history.

(56) References Cited

U.S. PATENT DOCUMENTS

| | | |
|---|---|---|
| 2004/0075434 A1 | 4/2004 | Vavrek |
| 2004/0186375 A1 | 9/2004 | Vavrek |
| 2005/0068030 A1 | 3/2005 | Mansfield |
| 2011/0316539 A1 | 12/2011 | Lagendijk |
| 2012/0271150 A1 | 10/2012 | Ehman |
| 2013/0184571 A1 * | 7/2013 | Wilkening ............. A61B 90/39 |
| | | 600/426 |
| 2015/0011865 A1 | 1/2015 | Goldhaber |

* cited by examiner

SYSTEM AND METHOD FOR REDUCING PERIPHERAL NERVE STIMULATION AT HIGHER GRADIENT AMPLITUDES AND FASTER GRADIENT SLEW RATES IN MAGNETIC RESONANCE IMAGING

CROSS-REFERENCE TO RELATED APPLICATIONS

This application represents the national stage entry of International Application PCT/IB2016/056565 filed Oct. 31, 2016, the contents of which are incorporated by reference in their entirety.

BACKGROUND OF THE DISCLOSURE

During magnetic resonance imaging ("MRI") procedures, magnetic field gradients or other time-varying magnetic fields may stimulate nerves or muscles in patients by inducing electrical fields. The potential for interactions between magnetic field gradients and biological tissues is dependent on a variety of factors including the fundamental field frequency, the maximum flux density, the average flux density, the presence of harmonic frequencies, the waveform characteristics of the signal, the polarity of the signal, the current distribution in the body, the electrical properties, and the sensitivity of the cell membrane.

Peripheral nerve stimulation ("PNS") is a physiological effect of the interaction of nerves with switching (a.k.a., slewing) the gradient coil in an MRI system. Rapidly changing magnetic fields produce electric fields that can stimulate nerves in the body, which can cause uncomfortable or painful sensations. The presence of PNS limits the performance of both conventional and anatomy-specific gradient coils found in MRI systems. Without the PNS effect, gradient coils could be designed or operated to have significantly faster slew rates, greater gradient strengths, or both, which would improve imaging performance by shortening scan times or increasing image quality.

Conventional MRI systems are operated with limitations to their performance that prevent the scanner from inducing PNS in the vast majority of people. These thresholds are established for each gradient coil through empirically testing exposure of different slew rates and amplitudes for a large number of subjects. Despite these limitations, there are cases where a person's threshold for PNS is lower (i.e., more sensitive) than typical, and if such a person is being scanned and experiences PNS, the scan may be stopped, at which point adjustments to the gradient coil settings used for the pulse sequence are required to resume scanning.

There remains a need, then, to provide systems and methods that allow for an increase to the PNS thresholds in most people, which would relax gradient coil limitations and enable improved MRI performance in a wide variety of MRI tasks.

SUMMARY OF THE PRESENT DISCLOSURE

The present disclosure addresses the aforementioned drawbacks by providing a method for imaging a subject with a magnetic resonance imaging ("MRI") system. The method includes selecting, with a computer system, gradient coil settings that define magnetic field gradients to be generated by a gradient coil in the MRI system. The gradient coil settings are selected based on at least one of a position, shape, size, or material of a dielectric assembly arranged adjacent a skin surface of a subject positioned within a magnetic field of the MRI system. The gradient coil settings include at least one of gradient amplitudes or gradient slew rates above a threshold at which peripheral nerve stimulation is likely to be induced in the subject when the dielectric assembly is not arranged adjacent the skin surface of the subject. Data are acquired from the subject with the MRI system operating to generate magnetic field gradients defined by the selected gradient coil settings. An image that depicts the subject is then reconstructed from the acquired data.

It is another aspect of the present disclosure to provide a method for reducing peripheral nerve stimulation in a subject during an imaging scan with an MRI system. The method includes arranging a dielectric assembly proximate an anatomical region of the subject in which peripheral nerve stimulation is to be reduced. Gradient coil settings that define magnetic field gradients to be generated by a gradient coil in the MRI system are selected with a computer system. The gradient coil settings include at least one of gradient amplitudes or gradient slew rates above a threshold at which peripheral nerve stimulation is likely to be induced in the anatomical region of the subject when the dielectric assembly is not arranged proximate the anatomical region. Data are acquired from the subject with the MRI system operating to generate magnetic field gradients defined by the selected gradient coil settings. Peripheral nerve stimulation is mitigated in the anatomical region by the dielectric assembly. An image that depicts the subject is then reconstructed from the acquired data.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Described here are systems and methods for safely imaging a subject with a magnetic resonance imaging ("MRI")

system using magnetic field gradients generated by one or more gradient coils operating with gradient coil settings (e.g., gradient amplitudes, gradient slew rates) above a threshold at which peripheral nerve stimulation ("PNS") is likely to be induced in the subject. A dielectric assembly is positioned adjacent a skin surface of the subject such that the dielectric assembly attenuates the local electric fields induced by the magnetic field gradients, and which would be likely to induce PNS when the dielectric assembly is not arranged adjacent the skin surface of the subject. As a result of the dielectric assembly placed adjacent the skin surface of the subject, the gradient coil settings can be increased above the threshold without inducing PNS in the subject.

Figure 1:
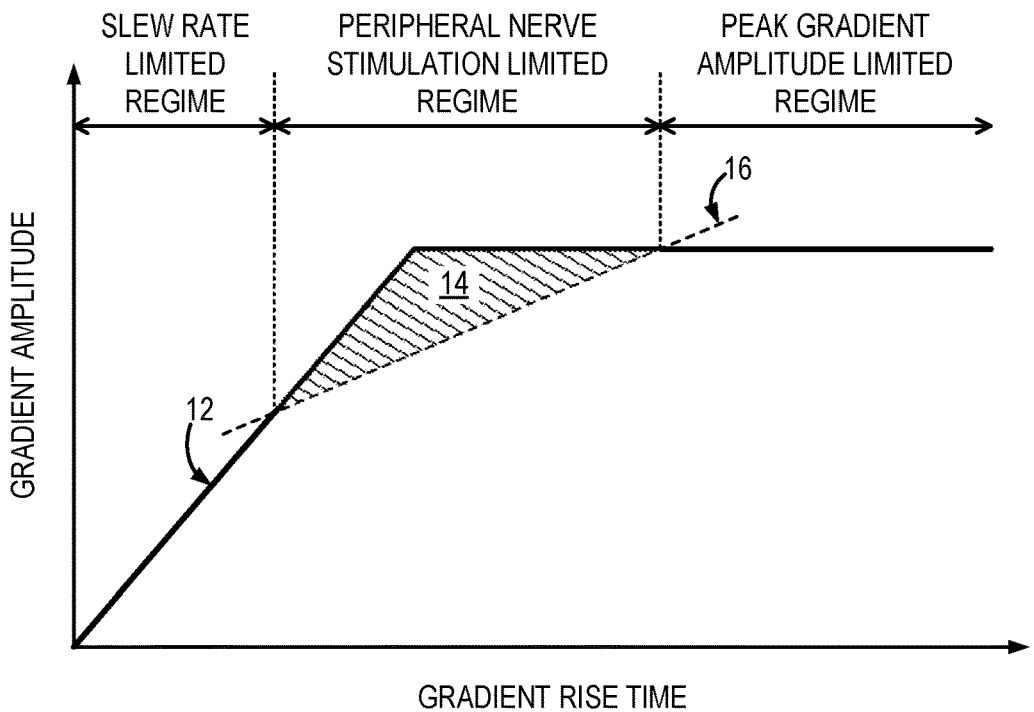
FIG. 1 is an example diagram illustrating gradient coil settings and the limitations that hardware and the risk of inducing peripheral nerve stimulation ("PNS") places on the selection of gradient coil settings for use in a magnetic resonance imaging ("MRI") scan.

FIG. 1 illustrates an example plot of gradient coil settings (e.g., gradient amplitudes, gradient rise times) for a gradient coil. Points on the plot shown in FIG. 1 correspond to combinations of gradient amplitude and gradient rise time values. The area above line 12 in FIG. 1 corresponds to combinations of gradient coil settings that are not attainable due to hardware limitations. For example, areas above the line 12 correspond to gradient slew rates (which is the inverse of gradient rise time) that cannot be attained due to hardware limitations, gradient amplitudes that exceed that maximum gradient amplitude attainable with the gradient coil, or both. Thus, areas above the line generally correspond to gradient slew rate limited regimes and gradient amplitude limited regimes.

As mentioned above, certain combinations of gradient rise time and gradient amplitude are likely to induce PNS in an average population. These combinations correspond to the shaded region 14, which is delimited by the line 12 and the PNS threshold line 16. Gradient amplitudes and rise times that are applied below the threshold 16 do not result in PNS, while combinations of these gradient coil settings above the threshold line 16 are likely to result in PNS being induced over an average population.

Figure 2:
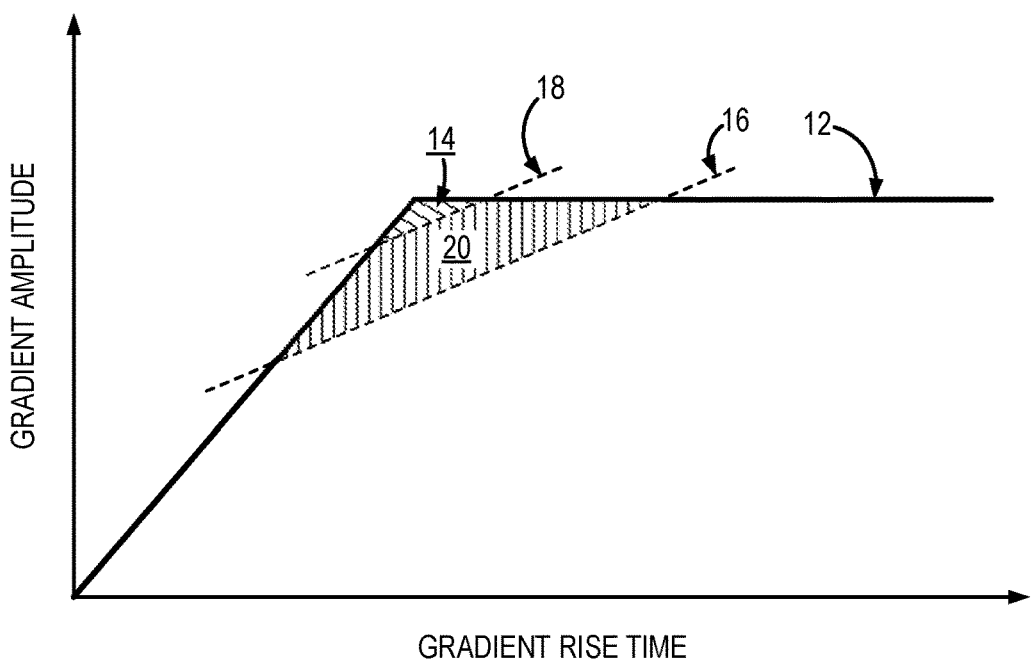
FIG. 2 is an example diagram illustrating an increase in the PNS threshold for gradient coil settings achieved through the use of arranging one or more dielectric assemblies adjacent a skin surface of a subject.

FIG. 2 illustrates the desired effect of increasing PNS thresholds by arranging one or more dielectric assemblies adjacent a skin surface of a subject. The dielectric assembly is designed to attenuate local electric fields that would be likely to induce PNS in the subject and, as such, increases the PNS threshold from line 16 to line 18 as shown in FIG. 2. By increasing the PNS thresholds, combinations of gradient coil settings in region 20 can be safely used without inducing PNS in a subject. Without arranging the dielectric assembly adjacent the skin surface of the subject, gradient coil settings in region 20 would not be safe to use as they would be likely to induce PNS in at least some subsets of an average population.

Figure 3:
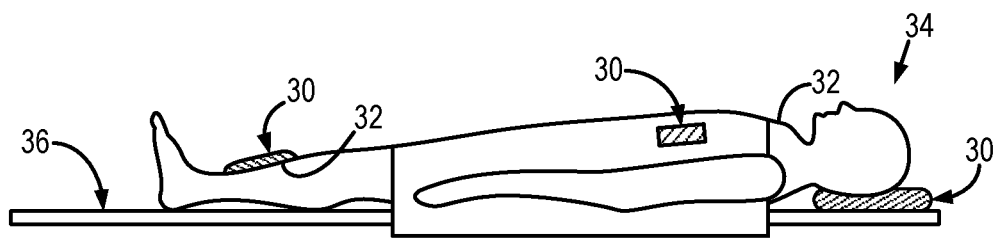
FIG. 3 illustrates an example of various different dielectric assemblies contemplated by the present disclosure being arranged adjacent the skin surface of a subject.

Referring now to FIG. 3, an example of a dielectric assembly 30 arranged adjacent a skin surface 32 of a subject 34 is illustrated. The dielectric assembly 30 is implemented to attenuate local electrical fields in the subject 34 that would otherwise be likely to induce PNS. Specifically, the dielectric assembly 30 can attenuate local electrical fields that are produced in response to magnetic gradient fields that were generated while operating a gradient coil using gradient coil settings above a conventional PNS threshold. As such, the dielectric assembly 30 provides for safely operating the gradient coil using gradient coil setting above a conventional PNS threshold level. It will be appreciated that more than one such dielectric assemblies can be arranged adjacent the subject depending on the imaging task at hand.

The dielectric assembly 30 can be arranged adjacent the skin surface 32 of the subject 34 by placing the dielectric assembly in direct contact with the skin surface 32 as shown in FIG. 3, or can be arranged adjacent the skin surface 32 of the subject 34 by spacing the dielectric assembly 30 at a distance from the skin surface 32, such that the dielectric assembly 30 is not in direct contact with the skin surface 32. For example, the dielectric assembly 30 can be arranged on a garment that is in direct contact with the skin surface 32 of the subject 34. As another example, the dielectric assembly 30 can be provided to the subject 34 via an adhesive bandage such that the dielectric assembly 30 is arranged adjacent but not in direct contact with the skin surface 32 of the subject 34.

The dielectric assembly 30 can include pads, fabrics, or enclosures containing gels or liquids. In general, such gels or liquids may include gel-based dielectric materials, liquid water-based dielectric materials, and mixtures of particulates in a liquid or gel. As an example, dielectric materials that can be used include slurries or gels containing barium titanate ($BaTiO_3$) or calcium titanate ($CaTiO_3$). In these latter examples, the dielectric material can include a dense aqueous suspension of barium titanate or calcium titanate, which can be formed into flexible pads, such as by heat sealing the suspension between two flexible substrates. In any case, the dielectric assembly 30 includes one or more dielectric materials or media. In some configurations, the dielectric assembly 30 may made to be rigid, while in other configurations the dielectric assembly 30 can be made to be flexible or otherwise conformable to the skin surface 32 of the subject 34.

Figure 4:
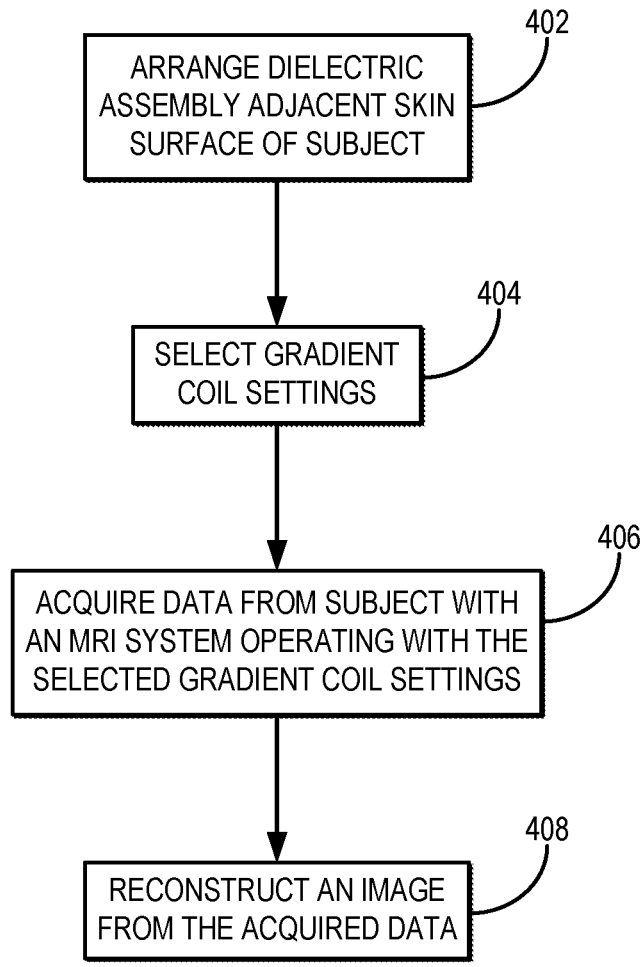
FIG. 4 is a flowchart setting forth the steps of an example method for imaging a subject using one or more dielectric assemblies arranged adjacent a skin surface of the subject so as to allow the use of gradient coil settings that without the dielectric assemblies present would be likely to induce PNS in the subject.

As one example, such as the one shown in FIG. 4, the dielectric assembly 30 can include a thin fabric containing a dielectric material. In this configuration, the dielectric assembly 30 can be form a part of a garment to be worn by the subject. For instance, the dielectric assembly 30 could include flexible pads or fabrics coupled to a garment to be worn by the subject during an imaging session. In such examples, the garment can be tight-fitting so as to place the dielectric assembly 30 into close proximity to the skin surface 32 of the subject 34.

In another example, the dielectric assembly 30 can include a rigid or flexible pad that can be positioned directly over specific regions of the subject 34 where peripheral nerve stimulation is likely or otherwise expected to occur. The dielectric assembly 30 can also include enclosures containing gels or liquids that include dielectric materials or media. Such enclosures can be rigid or flexible. As one example, the dielectric assembly 30 can include a gel pack containing a dielectric media, such as a hydrogel. As another example, the dielectric assembly can include a flexible or otherwise conformable enclosure (e.g., a plastic bag or the like) containing water.

The dielectric assembly 30 can be sized, shaped, or otherwise dimensioned to optimize the reduction of PNS in a particular region of a subject. To this end, a PNS test protocol can be conducted to establish population-general limits for specific geometries of pads, or the like, placed on the subject's body. As one example, in whole-body MRI systems, PNS may commonly occur in the arms, legs, or back, and different dielectric assemblies 30 can be constructed to be optimally sized, shaped, or otherwise dimensioned for these different anatomical regions.

In some configurations, the dielectric assembly 30 can be incorporated into the patient table 36. As one example, one or more dielectric assemblies 30 can be constructed as pads that are built into the patient table 36 to reduce PNS that may be induced in the subject's back. The dielectric assembly 30 can also be constructed as a pad or pillow on which the subject's head can rest. As another example, one or more dielectric assemblies 30 could be constructed to include tubes or sheaths into which the subject's arms or legs could be placed to reduce PNS that may be induced in the extremities. As another example, the dielectric assembly 30 can be constructed as a cap or mask that is placed over the subject's head of face.

Referring now to FIG. 4, a flowchart is illustrated as setting forth the steps of an example method for imaging a subject using one or more dielectric assemblies arranged adjacent a skin surface of the subject so as to allow the use of gradient coil settings that without the dielectric assemblies present would be likely to induce PNS in the subject. The method thus includes arranging one or more dielectric assemblies adjacent the skin surface of the subject, as indicated at step 402. Examples of such dielectric assemblies are described above. A dielectric assembly can be arranged adjacent the skin surface of the subject by placing the dielectric assembly in direct contact of the skin surface, or it can be arranged adjacent to the skin surface without directly contact the skin surface. For example, the dielectric assembly can be arranged adjacent the skin surface of the subject with a garment or other intervening object (even if just air) between the dielectric assembly and the skin surface of the subject.

Arranging the one or more dielectric assemblies adjacent the skin surface of the subject preferably includes arranging the one or more dielectric assemblies proximate to regions in the subject that are likely to be affected by PNS. Example regions can include the extremities, the back, the neck, and the head.

The method also includes setting gradient coil settings with a computer system, as indicated at step 404. The gradient coil settings are selected based on the one or more dielectric assemblies arranged adjacent a skin surface of the subject. In particular, the gradient coil settings are selected to include a combination of settings (e.g., gradient amplitude, gradient rise time or slew rate) that would likely result in generating magnetic field gradients that would induce PNS in the subject, but for the one or more dielectric assemblies being arranged adjacent the skin surface of the subject. In this manner, gradient coil settings that would otherwise not be safely implemented can be used. Advantageously, these gradient coil settings can result in generating stronger gradients, faster switching gradients, or both, which can improve imaging tasks such as diffusion imaging where stronger magnetic field gradients and faster gradient switching can be used to improve diffusion encoding.

After the gradient coil settings are selected, data are acquired from the subject with the MRI system, as recited in step 406. In particular, the MRI system is operated to perform a pulse sequence that includes generating magnetic field gradients based on the selected gradient coil settings. One or more images of the subject can then be reconstructed from the acquired data, as indicated at step 408.

Figure 5:
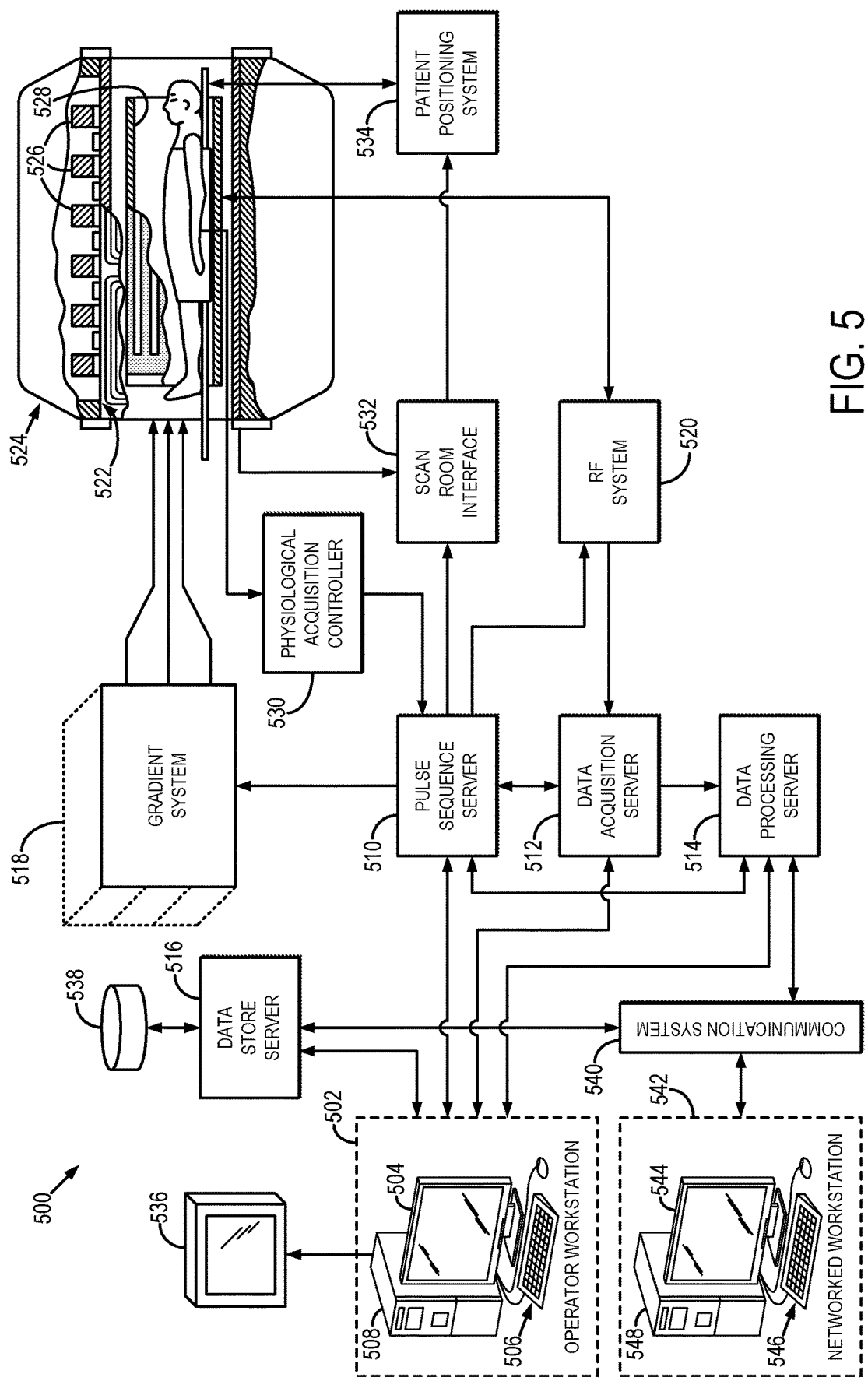
FIG. 5 is a block diagram of an example MRI system that can implement the methods described in the present disclosure.

Referring particularly now to FIG. 5, an example of an MRI system 500 that can implement the methods described here is illustrated. The MRI system 500 includes an operator workstation 502 that may include a display 504, one or more input devices 506 (e.g., a keyboard, a mouse), and a processor 508. The processor 508 may include a commercially available programmable machine running a commercially available operating system. The operator workstation 502 provides an operator interface that facilitates entering scan parameters into the MRI system 500. The operator workstation 502 may be coupled to different servers, including, for example, a pulse sequence server 510, a data acquisition server 512, a data processing server 514, and a data store server 516. The operator workstation 502 and the servers 510, 512, 514, and 516 may be connected via a communication system 540, which may include wired or wireless network connections.

The pulse sequence server 510 functions in response to instructions provided by the operator workstation 502 to operate a gradient system 518 and a radiofrequency ("RF") system 520. Gradient waveforms for performing a prescribed scan are produced and applied to the gradient system 518, which then excites gradient coils in an assembly 522 to produce the magnetic field gradients $G_x$, $G_y$, and $G_z$ that are used for spatially encoding magnetic resonance signals. These gradient waveforms can be defined by gradient coil settings (e.g., gradient amplitudes, gradient slew rates) selected based on the presence of one or more dielectric assemblies arranged adjacent the skin surface of the subject being imaged, or otherwise arranged proximate an anatomical region in which peripheral nerve stimulation is more likely to be induced in the subject. The gradient coil assembly 522 forms part of a magnet assembly 524 that includes a polarizing magnet 526 and an RF coil 528, which may be a whole-body RF coil.

RF waveforms are applied by the RF system 520 to the RF coil 528, or a separate local coil to perform the prescribed magnetic resonance pulse sequence. Responsive magnetic resonance signals detected by the RF coil 528, or a separate local coil, are received by the RF system 520. The responsive magnetic resonance signals may be amplified, demodulated, filtered, and digitized under direction of commands produced by the pulse sequence server 510. The RF system 520 includes an RF transmitter for producing a wide variety of RF pulses used in MRI pulse sequences. The RF transmitter is responsive to the prescribed scan and direction from the pulse sequence server 510 to produce RF pulses of the desired frequency, phase, and pulse amplitude waveform. The generated RF pulses may be applied to the RF coil 528 or to one or more local coils or coil arrays.

The RF system 520 also includes one or more RF receiver channels. An RF receiver channel includes an RF preamplifier that amplifies the magnetic resonance signal received by the RF coil 528 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \qquad (1);$$

and the phase of the received magnetic resonance signal may also be determined according to the following relationship:

$$\varphi = \tan^{-1}\left(\frac{Q}{I}\right). \qquad (2)$$

The pulse sequence server 510 may receive patient data from a physiological acquisition controller 530. By way of example, the physiological acquisition controller 530 may receive signals from a number of different sensors connected to the patient, including electrocardiograph ("ECG") signals from electrodes, or respiratory signals from a respiratory bellows or other respiratory monitoring devices. These signals may be used by the pulse sequence server 510 to synchronize, or "gate," the performance of the scan with the subject's heart beat or respiration.

The pulse sequence server 510 may also connect to a scan room interface circuit 532 that receives signals from various sensors associated with the condition of the patient and the magnet system. Through the scan room interface circuit 532, a patient positioning system 534 can receive commands to move the patient to desired positions during the scan.

The digitized magnetic resonance signal samples produced by the RF system 520 are received by the data acquisition server 512. The data acquisition server 512 operates in response to instructions downloaded from the operator workstation 502 to receive the real-time magnetic resonance data and provide buffer storage, so that data is not lost by data overrun. In some scans, the data acquisition server 512 passes the acquired magnetic resonance data to the data processor server 514. In scans that require information derived from acquired magnetic resonance data to control the further performance of the scan, the data acquisition server 512 may be programmed to produce such information and convey it to the pulse sequence server 510. For example, during pre-scans, magnetic resonance data may be acquired and used to calibrate the pulse sequence performed by the pulse sequence server 510. As another example, navigator signals may be acquired and used to adjust the operating parameters of the RF system 520 or the gradient system 518, or to control the view order in which k-space is sampled. In still another example, the data acquisition server 512 may also process magnetic resonance signals used to detect the arrival of a contrast agent in a magnetic resonance angiography ("MRA") scan. For example, the data acquisition server 512 may acquire magnetic resonance data and processes it in real-time to produce information that is used to control the scan.

The data processing server 514 receives magnetic resonance data from the data acquisition server 512 and processes the magnetic resonance data in accordance with instructions provided by the operator workstation 502. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 514 are conveyed back to the operator workstation 502 for storage. Real-time images may be stored in a data base memory cache, from which they may be output to operator display 502 or a display 536. Batch mode images or selected real time images may be stored in a host database on disc storage 538. When such images have been reconstructed and transferred to storage, the data processing server 514 may notify the data store server 516 on the operator workstation 502. The operator workstation 502 may be used by an operator to archive the images, produce films, or send the images via a network to other facilities.

The MRI system 500 may also include one or more networked workstations 542. For example, a networked workstation 542 may include a display 544, one or more input devices 546 (e.g., a keyboard, a mouse), and a processor 548. The networked workstation 542 may be located within the same facility as the operator workstation 502, or in a different facility, such as a different healthcare institution or clinic.

The networked workstation 542 may gain remote access to the data processing server 514 or data store server 516 via the communication system 540. Accordingly, multiple networked workstations 542 may have access to the data processing server 514 and the data store server 516. In this manner, magnetic resonance data, reconstructed images, or other data may be exchanged between the data processing server 514 or the data store server 516 and the networked workstations 542, such that the data or images may be remotely processed by a networked workstation 542.

The present disclosure has described one or more preferred embodiments, and it should be appreciated that many equivalents, alternatives, variations, and modifications, aside from those expressly stated, are possible and within the scope of the invention.

The invention claimed is:

1. A method for imaging a subject with a magnetic resonance imaging (MRI) system, the steps of the method comprising:
   (a) selecting with a computer system, gradient coil settings that define magnetic field gradients to be generated by a gradient coil in a magnetic resonance imaging (MRI) system, wherein:
      the gradient coil settings are selected based on at least one of a position, shape, size, or material of a dielectric assembly arranged adjacent a skin surface of a subject positioned within a magnetic field of the MRI system; and
      the gradient coil settings include at least one of gradient amplitudes or gradient slew rates above a threshold at which peripheral nerve stimulation is likely to be induced in the subject when the dielectric assembly is not arranged adjacent the skin surface of the subject;
   (b) acquiring data from the subject with the MRI system operating to generate magnetic field gradients defined by the selected gradient coil settings; and
   (c) reconstructing an image that depicts the subject from the acquired data.

2. A method for reducing peripheral nerve stimulation in a subject during an imaging scan with a magnetic resonance imaging (MRI) system, the steps of the method comprising:
   (a) arranging a dielectric assembly proximate an anatomical region of the subject in which peripheral nerve stimulation is to be reduced;
   (b) selecting with a computer system, gradient coil settings that define magnetic field gradients to be generated by a gradient coil in the MRI system, wherein the gradient coil settings include at least one of gradient amplitudes or gradient slew rates above a threshold at which peripheral nerve stimulation is likely to be induced in the anatomical region of the subject when the dielectric assembly is not arranged proximate the anatomical region;
   (c) acquiring data from the subject with the MRI system operating to generate magnetic field gradients defined by the selected gradient coil settings, wherein peripheral nerve stimulation is mitigated in the anatomical region by the dielectric assembly; and
   (d) reconstructing an image that depicts the subject from the acquired data.

3. The method as recited in claim 1, further comprising arranging the dielectric assembly adjacent the skin surface of the subject before acquiring data from the subject in step (b).

4. The method as recited in claim 3, wherein arranging the dielectric assembly adjacent the skin surface of the subject includes placing the dielectric assembly in contact with the skin surface of the subject.

5. The method as recited in claim 3, wherein arranging the dielectric assembly adjacent the skin surface of the subject includes spacing the dielectric assembly a distance away from the skin surface of the subject.

6. The method as recited in claim 3, wherein arranging the dielectric assembly adjacent the skin surface of the subject includes arranging the dielectric assembly proximate an anatomical region-of-interest that is sensitive to peripheral nerve stimulation.

7. The method as recited in claim 1, wherein the dielectric assembly comprises a flexible material containing a dielectric material.

8. The method as recited in claim 7, wherein the flexible material is a fabric.

9. The method as recited in claim 1, wherein the dielectric assembly comprises a rigid pad containing a dielectric material.

10. The method as recited in claim 1, wherein the dielectric assembly comprises a gel pack containing a dielectric gel material.

11. The method as recited in claim 1, wherein the selected gradient coil settings include a gradient amplitude that is higher than the threshold at which peripheral nerve stimulation is likely to be induced in the subject when the dielectric assembly is not arranged adjacent the skin surface of the subject.

12. The method as recited in claim 1, wherein the selected gradient coil settings include a gradient slew rate that is faster than the threshold at which peripheral nerve stimulation is likely to be induced in the subject when the dielectric assembly is not arranged adjacent the skin surface of the subject.

13. The method as recited in claim 12, wherein the selected gradient coil settings also include a gradient amplitude that is higher than the threshold at which peripheral nerve stimulation is likely to be induced in the subject when the dielectric assembly is not arranged adjacent the skin surface of the subject.

14. The method as recited in claim 2, wherein the dielectric assembly comprises a flexible material containing a dielectric material.

15. The method as recited in claim 14, wherein the flexible material is a fabric.

16. The method as recited in claim 2, wherein the dielectric assembly comprises a rigid pad containing a dielectric material.

17. The method as recited in claim 2, wherein the dielectric assembly comprises a gel pack containing a dielectric gel material.

* * * * *